United States Patent [19]

Lisco et al.

[11] Patent Number: 4,677,632
[45] Date of Patent: Jun. 30, 1987

[54] COUPLED LOOP CONTROLLER FOR A LASER TRANSMITTER

[75] Inventors: Richard J. Lisco, Whippany; Josef Ocenasek, Parsippany, both of N.J.

[73] Assignee: American Telephone and Telegraph Company, AT&T Bell Laboratories, Murray Hill, N.J.

[21] Appl. No.: 792,160

[22] Filed: Oct. 28, 1985

[51] Int. Cl.$^4$ .............................................. H01S 3/13
[52] U.S. Cl. ........................................ 372/38; 372/29
[58] Field of Search ........................ 372/26, 29, 33, 38

[56] References Cited

U.S. PATENT DOCUMENTS

| | | | |
|---|---|---|---|
| 3,755,697 | 8/1973 | Miller | 307/311 |
| 3,898,583 | 8/1975 | Shuey | 372/26 |
| 4,166,947 | 9/1979 | Dirksen | 250/199 |
| 4,412,140 | 10/1983 | Reynolds | 307/311 |

FOREIGN PATENT DOCUMENTS

WO82/01291  5/1983  PCT Int.'l Appl. .

OTHER PUBLICATIONS

*Electronics Letters*, F. S. Chen, Simultaneous Feedback Control of Bias and Modulation Currents for Injection Lasers, 3rd Jan. 1980, vol. 16 No. 1 pp. 7 and 8.

IEEE Transactions on Communications, J. Gruber, P. Marten, R. Petschacher, P. Russer, *Electronic Circuits for High Bit Rate Digital Fiber Optic Communications Systems*, J. Gruber, P. Marten, R. Petschacher, P. Russer, vol. Com-26 No. 7, Jul., 1978.

*IEEE Journal of Solid State Circuits*, R. Swartz, B. Wooley, A. Voshchenkow and G. Chin, *An Integrated Circuit for Multiplexing and Driving Injection Lasers*, vol. Sc-17, No. 4, Aug. 1982, pp. 753-760.

*Primary Examiner*—Gene Wan
*Attorney, Agent, or Firm*—Patrick E. Roberts

[57] ABSTRACT

The power output from a laser transmitter is maintained within predetermined levels. These levels are maintained at fixed percentages on either side of the average laser output power which is transmitted, regardless of variations in ambient temperature. This is achieved by coupling the bias current control loop to the modulation current control circuit.

3 Claims, 2 Drawing Figures

COUPLED LOOP CONTROLLER FOR A LASER TRANSMITTER

TECHNICAL FIELD

This invention relates to laser transmitter control circuits and, in particular, to a control circuit wherein the bias current control circuit is coupled to the modulation current control circuit.

BACKGROUND OF THE INVENTION

When power is plotted, as shown in FIG. 1, against current for a laser diode, unique characteristics are obtained for different ambient temperatures. Each characteristic has a linear portion which when extended would meet the current axis at a point known as the threshold current. When the laser transmitter is used in communications, the lasers are typically biased with a d.c. current near to but less than the threshold current. A modulation current is superimposed on the bias to swing the light output between a minimum and a maximum optical power corresponding respectively to logical zero and logical one. It is important that these minimum and maximum optical powers remain constant even when the laser threshold current and the slope of the characteristics change.

In the prior art, two different devices, known as single loop controllers and dual loop controllers, have been used to maintain the average optical power. According to one method, bias current is controlled. In this case the extinction ratio drops as ambient temperature rises. This problem occurs because of a corresponding decrease in the slope efficiency of its laser characteristic, that is, a decrease in efficiency with increasing temperature. To minimize this effect the temperature of the device was controlled.

According to the other method, both bias current and modulation current are controlled independently. This method determines peak and average optical output power via a backface monitor by measuring feedback current which is proportional to the light output power. This method requires high speed backface monitor and control circuits to measure the peak output power, hence the control loop must operate at the modulation rate.

SUMMARY OF THE INVENTION

The aforesaid problems are avoided by the present invention whereby the bias current control circuit is coupled to the modulation current control circuit. More particularly, a voltage signal proportional to the laser bias current at the emitter of a transistor within the bias current control circuit modifies a reference voltage signal and the modified reference signal is delivered as one of two inputs of a voltage to current converter within the modulation current control circuit. The other input to the voltage to current converter is a feedback signal proportional to the output from the modulation control current circuit. Thus the modulation current is controlled by the laser bias current.

The apparatus of the present invention has the simplicity of a single loop controller and the advantages of a dual loop controller. As bias current increases, the modulation current is increased, thereby keeping the output power and the extinction ratio constant. This eliminates the need for a temperature control circuit and a high speed peak power measuring control loop.

DETAILED DESCRIPTION

Figure 1:
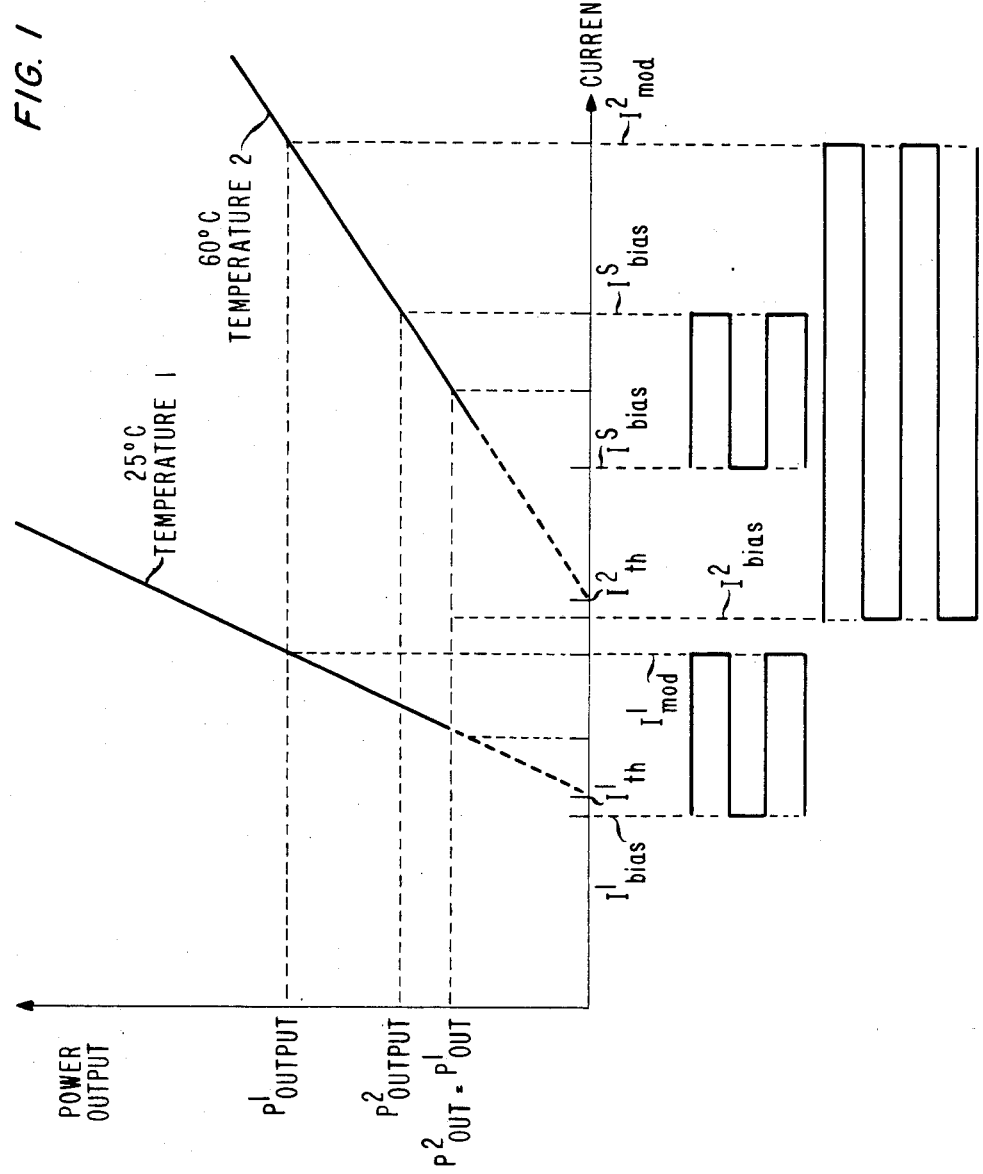
FIG. 1 shows power versus current characteristics of a laser transmitter varying with ambient temperature.
Figure 2:
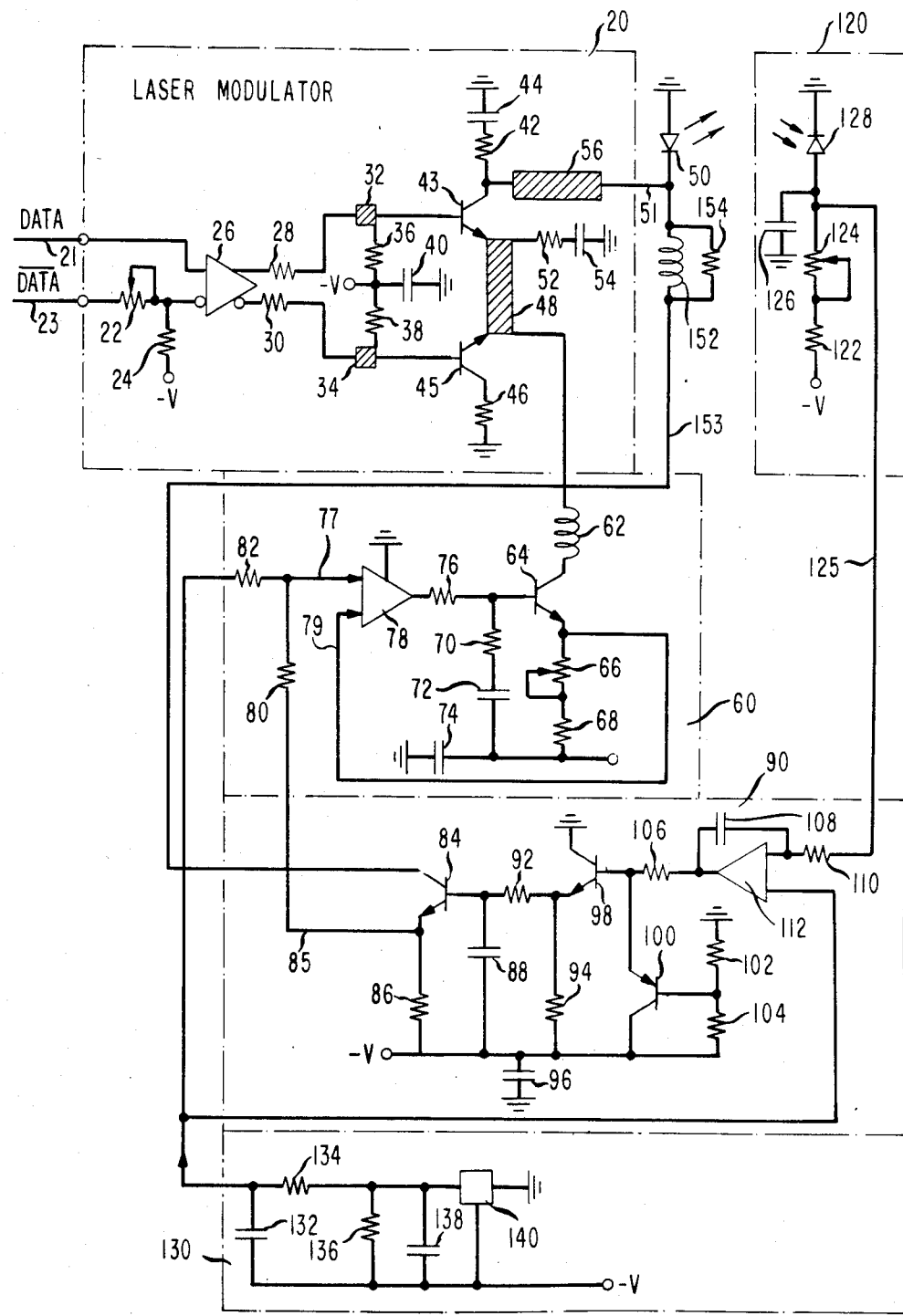
FIG. 2 shows a circuit coupling the bias current control circuit and the modulation current control circuit.

Referring to FIG. 2, input lead 21 carries signals, that is, logical 1's, 0's, to laser modulator 20. Input lead 23 is held at logic level 1. Modulator 20 varies the current through laser 50 and hence controls the optical output power therethrough. The duty cycle of the data signals is adjusted to compensate for timing errors occurring in laser modulator 20 by controlling the value of resistor 22 in the pair of resistors 22 and 24.

Emitter coupled logic (ECL) line receiver 26 provides a buffer for data signals on leads 21 which are input to modulator 20.

Level shifting between ECL line receiver 26 and switching transistors 43 and 45 is achieved by resistors 28, 30, 36 and 38. Series resistors 28 and 30 minimize ringing on the drive signal to switching transistors 43 and 45. Terminating resistors 36 and 38 serve as pull down resistors for the output signals of ECL line receiver 26. Transmission line pads 32 and 34 provide a controlled characteristic impedance.

The impedance of laser 50 approximates a five to ten ohm resistance in series with a five to ten nano Henry of package inductance. This low impedance will cause a reflection at the laser end of line 51 which connects to transistor 43. If the collector of transistor 43 is not terminated, a second reflection will subsequently occur at the sending end, and the line will ring. By providing a termination comprising resistor 42 and capacitor 44 at the collector of transistor 43, ringing is suppressed without introducing the voltage drop associated with a receiving end series termination.

Overshoot also results from parasitic capacitance at the emitters of transistors 43 and 45. To reduce this overshoot, the capacitance of the current source is isolated with a ferrite bead 62, switching transistors 43 and 45 having a high frequency and small geometry are chosen. Furthermore, a compensating resistor 52 and capacitor 54 are added to compensate for undershoot in the output current.

Resistor 46 functions to balance the voltage drop across laser diode 50 to insure that the power dissipation is about the same in both transistors 43 and 45.

Modulation current is provided by modulation current control circuit 60 which is a precision current source. Inductor 62 isolates the alternating current components from transistors 43 and 45 and prevents these components from entering transistor 64. Resistors 70, 76 and capacitor 72 form a R.F. decoupling network and also function to control the turn-on behavior of the current source, preventing modulation current transients which would damage the laser.

Operational amplifier 78 and transistor 64 together form a voltage to current converter. The output current from transistor 64 is proportional to the voltage on lead 77 at the input to amplifier 78. This voltage is proportional to the reference voltage from circuit 130 and to a voltage which, in turn, is proportional to the bias current from bias current control circuit 90. The extent to which the modulation current is controlled by the bias current is defined by the ratio of resistor 82 to resistor 80.

The aforesaid reference voltage is generated from circuit 130. Circuit 130 comprises an integrated circuit 140, resistors 134, 136 and capacitors 132, 138. A reference voltage is supplied to modulation current control circuit 60 and to bias current control circuit 90.

Energy proportional to the laser output power from diode 50 will be detected by photodiode 128 within backface monitor circuit 120. A current proportional to the average optical output power will flow through capacitor 126 and resistors 124 and 122. This current will produce a voltage with a magnitude proportional to current through photodiode 128 and the total resistance of elements 124 and 122. This voltage appears on lead 125 as an input to bias current control circuit 90.

Bias current control circuit 90 has an integrator and a voltage to current converter. The integrator comprising resistor 110, capacitor 108 and amplifier 112 integrates the difference between a reference voltage from voltage circuit 130 and a voltage proportional to the backface monitor current on line 125 from the backface monitor circuit 120.

The integrated output is then fed to a voltage controlled current source comprising transistors 98 and 84. Emitter current of transistor 84 produces a voltage across resistor 86 which is directly proportional to the laser bias current.

In accordance with the present invention, the voltage, at the emitter of transistor 84, and which is proportional to the bias current, is coupled to the modulation current control circuit 60. This is done by tying the emitter lead from transistor 84 via resistor 80 to the input of amplifier 78.

As output power from laser 50 increases, current from photodiode 128 in backface monitor 120 increases the voltage on lead 125. This increase causes a decrease in the output voltage from integrator 112 causing a reduction in the base voltage of transistor 98 and in turn that of transistor 84. Reduction in the base voltage to transistor 84 causes a reduction in the emitter current of transistor 84. The emitter current is proportional to the bias current on lead 153 from laser 50. When bias current drops, optical output power drops. A drop in the optical power causes a drop in the voltage input to integrator 112 and a rise in the output therefrom. A rise in the output from integrator 112 increases the base voltage to transistor 84 causing the bias current to increase. An increase in the bias current causes a proportional increase in optical power from laser diode 50. An increase in optical power causes, eventually, a reduction of bias current. The cycle repeats to maintain a constant optical power.

The bias current is measured by a voltage drop across resistor 86. An increase in the bias voltage results in an increase in the modulation current maintaining a constant extinction ratio.

What is claimed is:

1. Apparatus for controlling the power of a laser transmitter over a predetermined range of ambient temperatures said apparatus comprising
   a modulator for receiving data input as logical 1's and 0's and for converting said logical 1's and 0's into corresponding high and low levels of laser modulation current,
   a backface monitor for monitoring the power output from said laser and for generating a current proportional to said power output,
   means, responsive to the current from the backface monitor, for controlling bias current from said laser,
   means responsive to a reference voltage and to a voltage proportional to the laser bias current, for controlling said laser modulation current, and
   means for coupling the voltage proportional to the bias current from said bias current control means to said modulation current control means.

2. The apparatus of claim 1 wherein said means for controlling said bias current comprises
   means for converting said backface monitor current into a voltage,
   means for integrating said backface monitor voltage,
   means for converting said voltage to a current, said means comprising first and second transistors in cascade, the collector of said second transistor receiving the bias current from said laser and the current at the emitter of said second transistor being proportional to said collector current, and
   means for converting said emitter current to an emitter voltage.

3. The apparatus of claim 2 wherein said means for controlling said modulation current comprising
   a third transistor having said laser modulation current delivered at the collector thereof, and
   an operational amplifier having two input signals, one of said input signals being a feedback voltage signal which is proportional to the modulation current from the emitter of said third transistor, and said second input signal being a reference voltage signal modified by said emitter voltage from said second transistor, said operational amplifier providing the base signal for said third transistor.

* * * * *